(12) United States Patent
Coumou et al.

(10) Patent No.: US 10,692,698 B2
(45) Date of Patent: Jun. 23, 2020

(54) FEEDBACK CONTROL BY RF WAVEFORM TAILORING FOR ION ENERGY DISTRIBUTION

(71) Applicant: MKS Instruments, Inc., Andover, MA (US)

(72) Inventors: David J. Coumou, Webster, NY (US);
Ross Reinhardt, Rochester, NY (US);
Yuriy Elner, Pittsford, NY (US);
Daniel M. Gill, Macedon, NY (US);
Richard Pham, San Jose, CA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/509,088

(22) Filed: Jul. 11, 2019

(65) Prior Publication Data

US 2019/0333738 A1     Oct. 31, 2019

Related U.S. Application Data

(62) Division of application No. 14/837,512, filed on Aug. 27, 2015, now Pat. No. 10,395,895.

(51) Int. Cl.
*H01J 37/32* (2006.01)

(52) U.S. Cl.
CPC ...... *H01J 37/32155* (2013.01); *H01J 37/321* (2013.01); *H01J 37/32091* (2013.01);
(Continued)

(58) Field of Classification Search
None
See application file for complete search history.

(56) References Cited

U.S. PATENT DOCUMENTS

| 5,302,882 A | 4/1994 | Miller |
| 5,467,013 A | 11/1995 | Williams et al. |

(Continued)

FOREIGN PATENT DOCUMENTS

| CN | 101801153 A | 8/2010 |
| JP | 2014135305 A | 7/2014 |

(Continued)

OTHER PUBLICATIONS

Japanese Office Action for Application No. 2018-508214 dated Dec. 16, 2019, and its English translation thereof.
(Continued)

*Primary Examiner* — Crystal L Hammond
(74) *Attorney, Agent, or Firm* — Harness, Dickey & Pierce, P.L.C.

(57) ABSTRACT

A system for controlling RF power supplies applying power to a load, such as a plasma chamber, includes a master power supply and a slave power supply. The master power supply provides a control signal, such as a frequency and phase signal, to the slave power supply. The slave power supply receives the frequency and phase signal and also receives signals characteristic of the spectral emissions detected from the load. The slave RF power supply varies the phase and power of its RF output signal applied to the load. Varying the power controls the width of an ion distribution function, and varying the phase controls a peak of the ion distribution. Depending upon the coupling between the RF generators and the load, different spectral emissions are detected, including first harmonics, second harmonics, and, in the case of a dual frequency drive system, intermodulation distortion.

18 Claims, 9 Drawing Sheets

(52) U.S. Cl.
CPC .... *H01J 37/3299* (2013.01); *H01J 37/32165* (2013.01); *H01J 37/32972* (2013.01); *H01J 2237/334* (2013.01)

(56) References Cited

U.S. PATENT DOCUMENTS

| | | | |
|---|---|---|---|
| 5,576,629 | A | 11/1996 | Turner et al. |
| 6,008,928 | A | 12/1999 | Sachse et al. |
| 6,020,794 | A | 2/2000 | Wilbur |
| 6,064,064 | A | 5/2000 | Castleman |
| 6,180,415 | B1 | 1/2001 | Schultz et al. |
| 6,201,208 | B1 | 3/2001 | Wendt et al. |
| 6,313,584 | B1 | 11/2001 | Johnson et al. |
| 6,441,380 | B1 | 8/2002 | Lawandy |
| 6,441,620 | B1 | 8/2002 | Scanlan et al. |
| 6,449,568 | B1 | 9/2002 | Gerrish |
| 6,618,276 | B2 | 9/2003 | Bennett |
| 6,771,368 | B1 | 8/2004 | Chadwick |
| 6,791,274 | B1 | 9/2004 | Hauer et al. |
| 7,206,184 | B2 * | 4/2007 | Ennis ............... H01J 37/32165 361/230 |
| 7,602,127 | B2 | 10/2009 | Coumou |
| 7,901,952 | B2 | 3/2011 | Hoffman et al. |
| 8,040,068 | B2 | 10/2011 | Coumou et al. |
| 8,110,991 | B2 | 2/2012 | Coumou |
| 8,395,322 | B2 | 3/2013 | Coumou |
| 8,773,019 | B2 | 7/2014 | Coumou et al. |
| 8,995,502 | B1 | 3/2015 | Lai et al. |
| 9,309,594 | B2 | 4/2016 | Hoffman et al. |
| 9,336,995 | B2 | 5/2016 | Coumou et al. |
| 9,408,288 | B2 | 8/2016 | Valcore, Jr. et al. |
| 9,536,749 | B2 | 1/2017 | Marakhtanov et al. |
| 2002/0026251 | A1 | 2/2002 | Johnson et al. |
| 2002/0132479 | A1 | 9/2002 | Coumou |
| 2003/0057847 | A1 | 3/2003 | Strang |
| 2003/0143554 | A1 | 7/2003 | Berres et al. |
| 2004/0004708 | A1 | 1/2004 | Willis |
| 2004/0107908 | A1 | 6/2004 | Collins et al. |
| 2004/0183019 | A1 | 9/2004 | Mandelis et al. |
| 2005/0060103 | A1 | 3/2005 | Chamness |
| 2005/0136604 | A1 | 6/2005 | Al-Bayati et al. |
| 2006/0239389 | A1 | 10/2006 | Coumou |
| 2007/0246162 | A1 | 10/2007 | Paterson et al. |
| 2008/0024158 | A1 | 1/2008 | Turner et al. |
| 2008/0178803 | A1 | 7/2008 | Collins et al. |
| 2008/0182418 | A1 | 7/2008 | Collins et al. |
| 2009/0252196 | A1 | 10/2009 | Icove et al. |
| 2010/0194195 | A1 | 8/2010 | Coumou et al. |
| 2011/0174606 | A1 | 7/2011 | Funk et al. |
| 2011/0248634 | A1 | 10/2011 | Heil et al. |
| 2012/0098545 | A1 | 4/2012 | Son et al. |
| 2012/0163508 | A1 | 6/2012 | Kuffner et al. |
| 2012/0217221 | A1 * | 8/2012 | Hoffman ............... C23C 14/345 216/61 |
| 2013/0214828 | A1 | 8/2013 | Valcore, Jr. et al. |
| 2013/0256271 | A1 * | 10/2013 | Panagopoulos ....... H01J 37/321 216/68 |
| 2014/0055034 | A1 | 2/2014 | Coumou |
| 2014/0062495 | A1 | 3/2014 | Carter et al. |
| 2014/0097908 | A1 | 4/2014 | Fisk, II et al. |
| 2014/0172374 | A1 | 6/2014 | Brady |
| 2014/0263199 | A1 * | 9/2014 | Nelson ............... H01J 37/32082 219/121.4 |
| 2014/0264068 | A1 | 9/2014 | Brucker et al. |
| 2014/0265833 | A1 | 9/2014 | Albarede |
| 2014/0320013 | A1 * | 10/2014 | Coumou ........... H01J 37/32082 315/111.21 |
| 2014/0367043 | A1 * | 12/2014 | Bishara ............. H01J 37/32183 156/345.28 |
| 2018/0053633 | A1 * | 2/2018 | Glazek .............. H01J 37/32174 |

FOREIGN PATENT DOCUMENTS

| | | |
|---|---|---|
| JP | 2014239029 A | 12/2014 |
| TW | 201347615 A | 11/2013 |
| TW | 201436656 A | 9/2014 |
| TW | 201505489 A | 2/2015 |
| WO | WO-2014-143215 A1 | 9/2014 |

OTHER PUBLICATIONS

Chinese Office Action dated Nov. 4, 2019 for Application No. 201680049837.2, and its English translation thereof.

Abraham, I.C., J.R. Woodworth, M.E. Riley, P.A. Miller, T.W. Hamilton, and B.P. Aragon. "Ion Energy Distribution Versus Frequency and Ion Mass at the RF-Biased Electrode in an Inductively Driven Discharge." *American Vacuum Society* 20.5 (2002): 1759-17682. Print.

Barnes, Michael S., John C. Forster, and John H. Keller. "Ion Kinetics in Low-Pressure, Electropositive, RF Glow Discharge Sheaths." *IEEE Transactions of Plasma Science* 19.2 (1991): 240-44. Print.

Boyle, P.C., A.R. Ellingboe and M.M. Turner. "Independent Control of Ion Current and Ion Impact Energy Into Electrodes in Dual Frequency Plasma Devices." *Journal of Physics D: Applied Physics* 37 (2004): 697-701. Web. Feb. 11, 2004.

Chinese Office Action for Application No. 201680049837.2 dated Jan. 28, 2019, and its English translation thereof.

Coumou, David J., David Hamilton Clark, Theresa Kummerer, Michael Hopkins, Donal Sullivan, and Steven Shannon. "Ion Energy Distribution Skew Control Using Phase-Locked Harmonic RF Bias Drive." *IEEE Transactions of Plasma Science* 42.7 (2014): 1880-1893. Print.

Extended European Search Report for European Patent Application No. 16839735.4, dated Mar. 6, 2019.

Heil, Brian G., Uwe Czarnetzki, Ralf Peter Brinkmann, and Thomas Mussenbrock. "On the Possibility of Making a Geometrically Symmetric RF-CCP Discharge Electrically Asymmetric." *Journal of Physics D: Applied Physics* 41.165202 (2008): 1-19. Web. Jul. 24, 2008.

International Search Report for Application No. PCT/US2016/032158 dated Aug. 23, 2016.

Japanese Office Action dated Jun. 24, 2019 for Application No. 2018-508214, and its English translation thereof.

Qin, X.v., Y-H Ting, and A.E. Wendt. "Tailored Ion Energy Distributions at an RF-Biased Plasma Electrode." *Plasma Sources Science and Technology* 19.065014 (2010): 1-8. Web. Nov. 16, 2010.

Shannon, Steven, Daniel Hoffman, Jang-Gyoo Yang, Alex Paterson, and John Holland. "The Impact of Freqency Mixing on Sheath Properties: Ion Energy Distribution and Vdc/Vrf Interation." *Journal of Applied Physics* 97.103304 (2005). Web. May 11, 2005.

Taiwan Office Action for Application No. 105118672 dated May 9, 2018, and its English translation thereof.

Wang, S.-B and A.E. Wendt. "Ion Bombardment Energy and SiO2/Si Fluorocarbob Plasma Etch Selectivity." *American Vacuum Society* 19.5(2001): 2425-2432. Print.

Zhang, Yiting, Abdullah Zafar, David J. Coumou, Steven C. Shannon, and Mark J. Kushner. "Control of Ion Energy Distributions Using Phase Shifting in Multi-Frequency Capacitively Coupled Plasmas." *Journal of Applied Physics* 117.233302 (2015): 1-15. Print.

International Preliminary Report on Patentability and Written Opinion of the Searching Authority for International App. No. PCT/US2016/032158, dated Mar. 8, 2018.

* cited by examiner

FEEDBACK CONTROL BY RF WAVEFORM TAILORING FOR ION ENERGY DISTRIBUTION

CROSS-REFERENCE TO RELATED APPLICATIONS

This application is a divisional of U.S. application Ser. No. 14/837,512, filed on Aug. 27, 2015. The entire disclosure of the above application is incorporated herein by reference.

FIELD

The present disclosure relates to RF generator systems and to RF generator control systems.

BACKGROUND

This section provides background information related to the present disclosure which is not necessarily prior art.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network, and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power source or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In a typical RF power supply configuration, output power applied to the load is determined by using sensors that measure the forward and reflected power or the voltage and current of the RF signal applied to the load. Either set of these signals is analyzed in a typical control loop. The analysis typically determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias power and a source power applied to one or a plurality of electrodes. The source power typically generates the plasma, and the bias power tunes the plasma to an energy relative to the bias RF power supply. The bias and the source may share the same electrode or may use separate electrodes, in accordance with various design considerations.

When a RF power delivery system drives a load in the form of a plasma chamber, the electric field generated by the power delivered to the plasma chamber results in ion energy within the chamber. One characteristic measure of ion energy is the ion energy distribution function (IEDF). The ion energy distribution function (IEDF) can be controlled with a RF waveform. One way of controlling the IEDF for a system in which multiple RF power signals are applied to the load occurs by varying multiple RF signals that are related by frequency and phase. The frequencies between the multiple RF power signals are locked, and the relative phase between the multiple RF signals is also locked. Examples of such systems can be found with reference to U.S. Pat. Nos. 7,602,127, 8,110,991, and 8,395,322, assigned to the assignee of the present invention and incorporated by reference in this application.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system controls the generation of the plasma, and the other frequency (the bias) of the dual frequency system controls ion energy. Examples of dual frequency systems include systems that are described in U.S. Pat. Nos. 7,602,127; 8,110,991; and 8,395,322 referenced above. The dual frequency system described in the above-referenced patents requires a closed-loop control system to adapt RF power supply operation for the purpose of controlling ion density and its corresponding ion energy distribution function (IEDF).

Multiple approaches exist for controlling a plasma chamber for generating plasmas. For example, phase and frequency of the driving RF signals may be used to control plasma generation. For RF driven plasma sources, the periodic waveform effecting plasma sheath dynamics and the corresponding ion energy is generally known and the frequency of the periodic waveforms and the associated phase interaction. Another approach involves dual frequency operation. That is two RF frequency sources are used to power a plasma chamber to provide substantially independent control of ion and electron densities.

Another approach utilizes wideband RF power sources to drive a plasma chamber, but includes certain difficulties. One difficulty is coupling the power to the electrode. A second difficulty involves that the transfer function of the generated waveform to the actual sheath voltage for a desired IEDF must be formulated for a wide-process space to support material surface interaction. In yet another approach, in an inductively coupled plasma approach, controlling power applied to a source electrode controls the plasma density while controlling power applied to the bias electrode controls the IEDF to provide etch rate control. By using source electrode and bias electrode control, the etch rate is controlled via the ion density and energy.

While the above systems enable a certain degree of control of a plasma process, the continually increasing need for smaller components and increased yields demand continual improvement over the above-described approaches.

SUMMARY

This section provides a general summary of the disclosure, and is not a comprehensive disclosure of its full scope or all of its features.

A radio frequency (RF) generator system includes a power source that generates a RF output signal applied to a load. A sensor detects spectral emissions from the load, where the spectral emissions include at least one of harmonics and intermodulation distortion (IMD). A control module varies the output signal in accordance with one of the harmonics or the IMD detected in the spectral emissions.

A radio frequency (RF) power delivery system includes a first power supply that generates a first RF output signal and a second power supply that generates a second RF output signal. A sensor detects spectral emissions from a load, where the spectral emissions include at least one of a harmonic of the first or second power supply and intermodulation distortion (IMD) between the first RF signal and the second RF signal. A controller varies the second RF output signal in accordance with at least one of a control signal from the first power supply, or at least one of the harmonic or the IMD.

A radio frequency (RF) system includes a first RF generator having a first power source, where the first RF generator generates a control signal. A second RF generator includes a second power source, where the second RF generator receives the control signal from the first RF generator. The control signal includes phase and frequency information. The second RF generator has a signal processing unit, and generates the signal processing unit generating at least one of a phase or a power command applied to the second power source.

A controller for a RF power supply system includes a harmonic/intermodulation distortion (IMD) processor. The IMD processor receives a frequency input signal and spectral emissions sensed from a load, and the harmonic/IMD processor generates a phase setting. A phase determination processor receives at least one of the frequency input signal, the phase setting, or a sensor signal characteristic of a power applied to the load. The phase determination processor generates a phase control signal in accordance with the received signals.

A method for controlling a radio frequency (RF) generator includes detecting spectral emissions from a load, where the spectral emissions have at least one a harmonic and intermodulation distortion (IMD). An output signal of a RF power source is varied in accordance with one of the harmonic or the IMD detected in the spectral em issions.

Further areas of applicability of the present disclosure will become apparent from the detailed description, the claims and the drawings. The detailed description and specific examples are intended for purposes of illustration only and are not intended to limit the scope of the disclosure.

DRAWINGS

The drawings described herein are for illustrative purposes only of selected embodiments and not all possible implementations, and are not intended to limit the scope of the present disclosure.

The present disclosure will become more fully understood from the detailed description and the accompanying drawings. The drawings described herein are for illustrative purposes only of selected embodiments and not all possible implementations, and are not intended to limit the scope of the present disclosure.

In the drawings, reference numbers may be reused to identify similar and/or identical elements.

DETAILED DESCRIPTION

Example embodiments will now be described more fully with reference to the accompanying drawings.

Example embodiments will now be described more fully with reference to the accompanying drawings.

Figure 1:
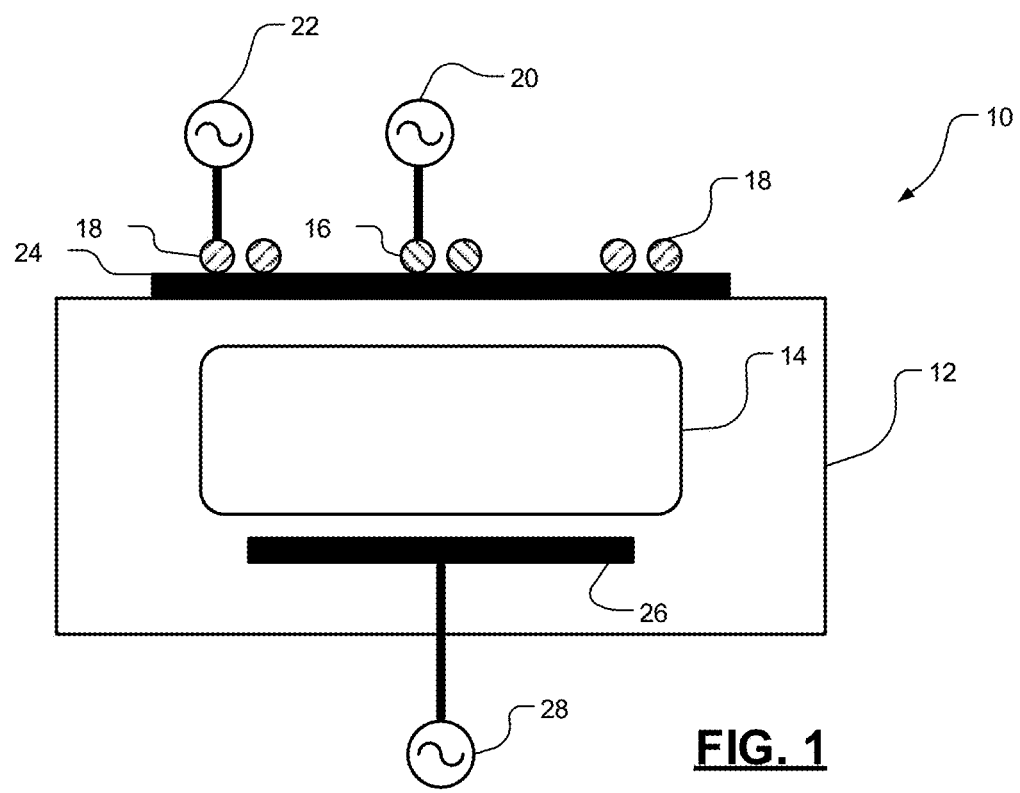
FIG. 1 depicts a representation of an inductively coupled plasma system.

FIG. 1 depicts an exemplary representation of an inductively coupled plasma (ICP) system 10. ICP system 10 includes a plasma chamber 12 for generating plasma 14. Power in the form of voltage or current is applied to plasma chamber 12 via a pair of coils, including an inner coil 16 and an outer coil 18. Power is applied to inner coil 16 via a RF power source 20, and power is applied to outer coil 18 via a RF generator or power source 22. Coils 16 and 18 are mounted to a dielectric window 24 that assists in coupling power to plasma chamber 12. A substrate 26 is placed in plasma chamber 12 and typically forms the work piece that is the subject of plasma operations. A RF generator or power source 28 applies power to plasma chamber 12 via substrate 26. In various configurations, the RF power sources 20, 22 provide a bias voltage or current to ignite or generate plasma 14. Also in various configurations, RF power supply 28 provides a bias voltage or current that varies the ion energy and/or ion density of the plasma 14. In various configurations, RF sources 20, 22, and 28 are locked to operate at the same frequency, voltage, and current, with fixed or varying relative phases. In various other configurations, RF sources 20, 22, and 28 may operate at different frequencies, voltages, and currents, and relative phases.

Figure 2:
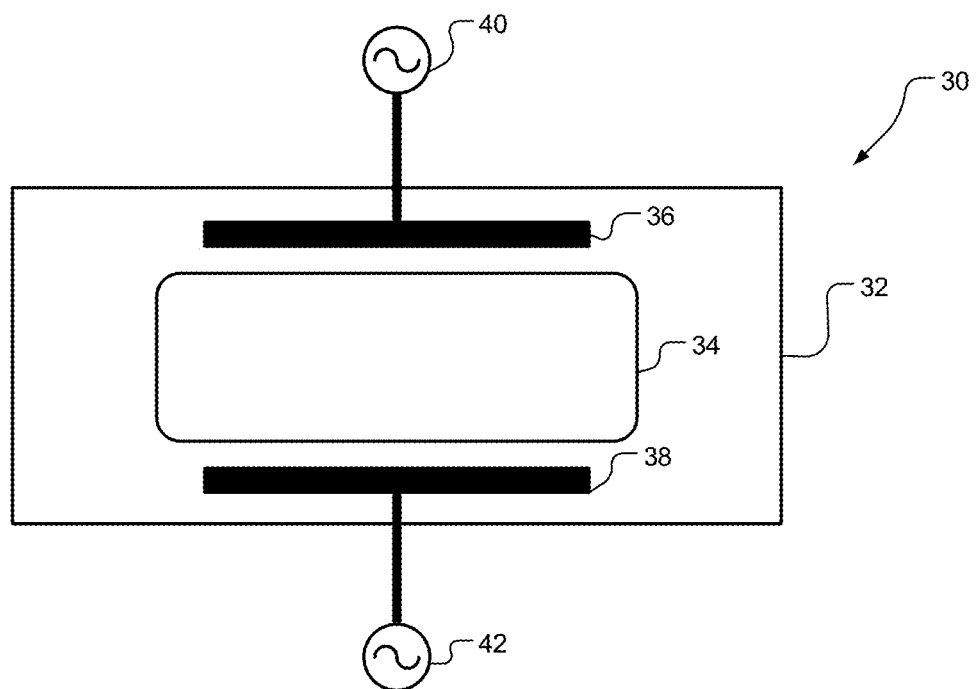
FIG. 2 depicts a representation of a capacitively coupled plasma system.

FIG. 2 depicts an exemplary representation of a capacitively coupled plasma (CCP) system 30. CCP system 30 includes a plasma chamber 32 for generating plasma 34. A pair of electrodes 36, 38 placed within plasma chamber 32 connect to respective RF generators or power sources 40, 42. In various configurations, RF power source 40 provides a source voltage or current to ignite or generate plasma 34. Also in various configurations, RF power source 42 provides a bias voltage or current that varies the ion energy and/or ion density of the plasma 34. In various configurations, power sources 40, 42 operate at the same frequencies, voltages, and currents, and relative phases. In various other configurations, power supplies 40, 42 operate at different frequencies, voltages, and currents, with fixed or varying relative phases. Also in various configurations, power supplies 40, 42 can be connected to the same electrode, while the other electrode is connected to ground or to yet a third RF generator.

Figure 3:
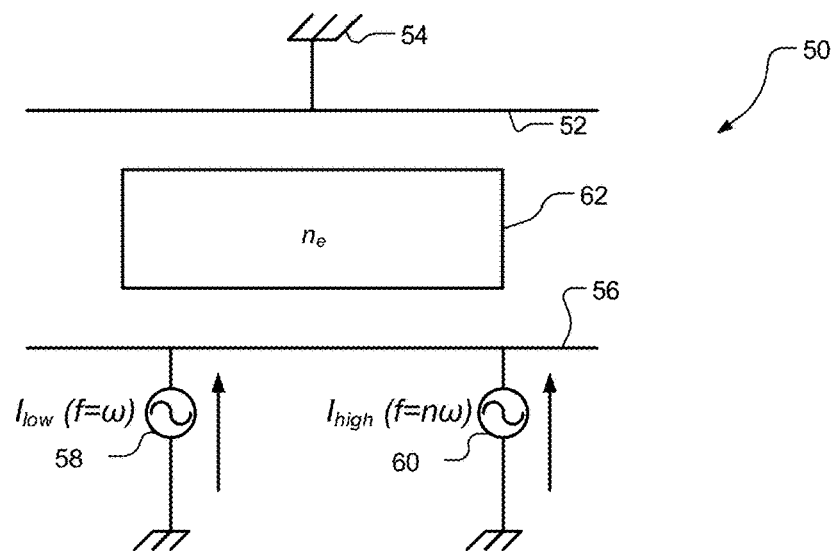
FIG. 3 depicts a generalized representation of a plasma system arranged according to various embodiments of the present disclosure.

FIG. 3 depicts a generalized representation of a dual frequency plasma system 50 and will be used to describe general operation of the RF power system of the present disclosure. Plasma system 50 includes a first electrode 52 connected to a ground 54 and a second electrode 56 spaced apart from first electrode 52. A low frequency first power source 58 generates a first RF power applied to second electrode 56 at a first frequency f. A high-frequency second power source 60 generates a second RF power applied to second electrode 56 at a second frequency $n\omega$ that is the $n^{th}$ harmonic frequency of the frequency of first power source 58.

Application of the respective first and second powers to second electrode 56 generates plasma 62 having an electron density $n_e$. Within the plasma 62 is a sheath layer which has a greater density of positive ions, and, thus, an overall excess positive charge that balances an opposite negative charge on the surface of a material within the plasma (not shown) with which it is in contact. Determining the position of the sheath is relevant to the plasma processing operation. The position of the sheath relative to first electrode 52 and second electrode 56 can be defined in accordance with the sheath modulation function shown in equation (1):

$$s(t) = \Sigma_{\forall n}(s_n + s_n \sin(n2\pi ft + \theta_n)) \tag{1}$$

where:
$\omega = 2\pi f$ is the lower frequency f of the dual frequency system; and
$\theta_n$ is the relative phase between the frequencies, in this case for harmonic tones (n>1).

The term $s_n$ is the amplitude of the sheath oscillation and is defined in equation (2):

$$s_n = \frac{I_n}{en_e n\omega A} \forall n \tag{2}$$

where:
$I_n$ is the drive current associated with $\omega_n$;
$n_e$ is the electron density;
A is the electro discharge area; and
e is electron charge.

The above equations (1) and (2) demonstrate that the position of the sheath varies in accordance with the relative phase between θ, in the case of equation (1), and the applied power, $I_n$ in the case of equation (2). In terms of the IEDF, the applied power $I_n$ is sometimes referred to as the relative amplitude variable or width, and the relative phase θ is sometimes referred to as the relative phase variable or skew.

A useful property characterizing the sheath can be found with respect to the sheath voltage described below with respect to equation (3):

$$V_{sh}(t) = -\frac{en_e}{2e_0}s^2(t) \tag{3}$$

where
$e_0$ is the electron charge permittivity of free space, and
e, $n_e$, and s(t) are as described above.

From the amplitude of the sheath oscillation $s_n$, an ion voltage for the plasma can be determined in accordance with equation (4):

$$V_{ion}(t) = \frac{en_e}{2e_0}\left[\sum\nolimits_{\forall n}(s_n + \alpha_n \sin(n2\pi ft + \theta_n))\right] \tag{4}$$

where:
$s_n$, e, $n_e$, $e_0$, n, f, and θ are described above; and $$\alpha_n = \frac{s_n}{n\omega\tau_i} \tag{5}$$

where:
$s_n$, n, and ω are described above; and $$\tau_i = 3\sqrt{\frac{m_i}{2eV_{DC}}} \tag{6}$$

where:

m$_i$ is the mass of the ions; and

V$_{DC}$ is direct current (DC) voltage that characterizes the plasma.

Figure 4:
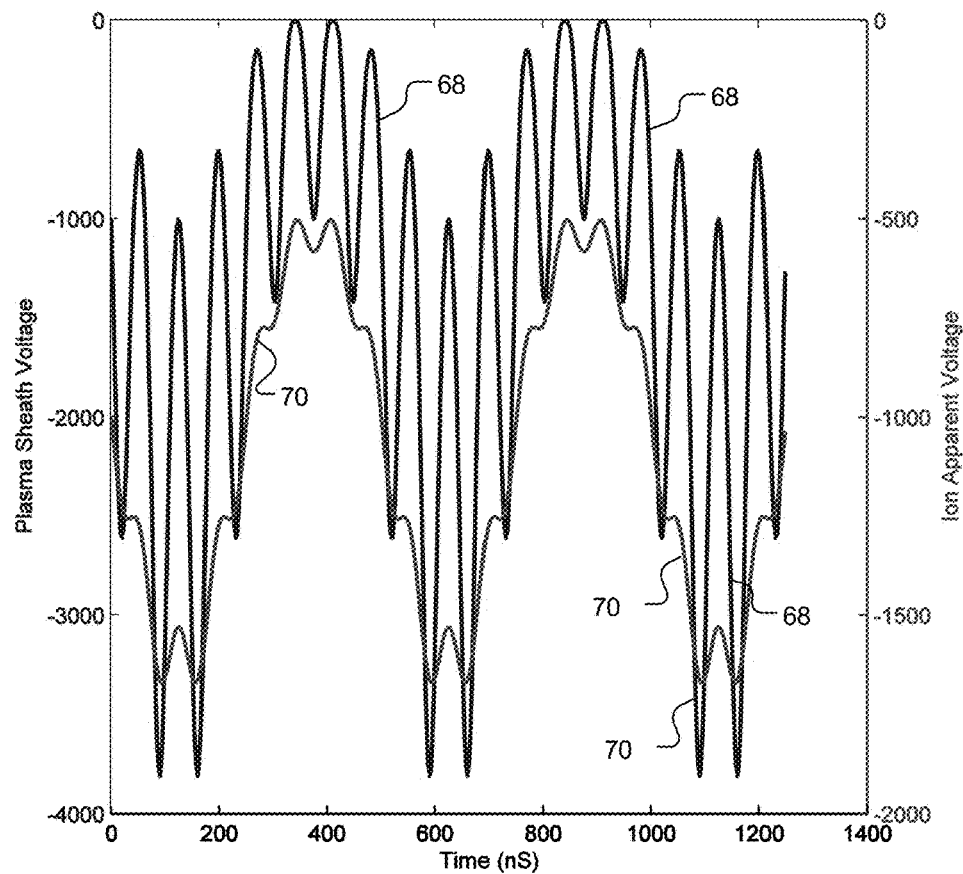
FIG. 4 depicts waveforms of the plasma sheath voltage and the ion apparent voltage relating to time for a particular implementation of the plasma system of FIG. 3.

FIG. 4 presents waveforms demonstrating the plasma sheath voltage V$_{sh}$(t) shown at waveform 68 and the ion apparent voltage V$_{ion}$(t) shown at waveform 70. The scale for the plasma sheath voltage 68 is provided on the left y-axis, and the scale for the ion apparent voltage 70 is provided on the right y-axis. The x-axis provides a timescale in nanoseconds. As can be seen from FIG. 4, the ion apparent voltage shown at waveform 70 provides an approximate envelope for the plasma sheath voltage 68.

Driving one electrode of the pair at multiple harmonics enables the control of the DC self-bias electrically by adjusting the phase between the driving frequencies. Driving one electrode also enables tailoring the shape of the IEDF by controlling higher-order moments of the IEDF and customizing the sheath voltage waveform at the substrate. To adjust to a specific IEDF, the equations above for sheath dynamics can be particularized. For example, assuming that the plasma system 10 of FIG. 3 is a dual frequency, CCP system, the sheath thickness is described as a function of time in equation (7):

$$s(t) = s_1(1-\sin(\omega t)) + s_2(1-\sin(\omega n t + \varphi)) \quad (7)$$

where:

$\omega = 2\pi f$ is described above for equation (1); and $\varphi$ is the relative phase between the harmonic tones (n>1).

Equation (7) is a thus particular representation of equation (1), with n=2. The amplitudes of the sheath oscillation are defined by equation (2), above. Further, the time dependent sheath voltage is described by equation (8):

$$V_{bias}(t) = \frac{e\eta_e}{2\varepsilon_0} s^2(t) \quad (8)$$

where the equation terms are described above with respect to equation (3). It should be noted that equations (3) and (8) are similar and differ with one being the negative of the other.

From the above equations, the relative phase and current magnitude are controllable elements of the RF power delivery system. Power setpoints adjust the corresponding I$_n$ of equation (2), and the frequencies of the dual RF power delivery system are harmonically derived, enabling phase locking. The sheath voltage V$_{bias}$(t) of equation (8) is governed by the frequency, phase, and amplitude of the RF signal to produce specific IEDFs from the arbitrary waveform generation with the RF power delivery scheme. In summary, (1) the sheath voltage is a function of the driven frequencies and the power absorbed; (2) the ion voltage is directly influenced by the sheath voltage; and (3) the sheath voltage may control the RF power supply to influence the ion voltage and the distribution of the ion energy.

In a particular example of the generalized description above for sheath dynamics, for an ICP source, the plasma sheath relationship between dual inductive coils and between these coils and the bias cathode benefit from digital phase lock loop. For an ICP systems with dual inductive coils, the sheath thickness described in equation (1) (with n=2) is generalized and parameterized as a function of time as shown in equation (9)

$$s(t) = \alpha_i \sin(\omega t + \phi_i) + \alpha_o \sin(\omega t + \phi_o) + s_b \sin(\omega t + \phi_b) \quad (9)$$

where:

$\alpha_i$ and $\alpha_o$ are the amplitudes of the sheath oscillation from the sources for the respective inner and outer coils;

$s_b$ is the amplitude of the sheath oscillation for the bias; and $\phi$ is the relative phase between the RF signals applied to the respective source and bias. For both sheath modulation functions, the bias voltage is obtained by a squaring of the time-varying sheath equation (9). By squaring a function of sinusoids, harmonics components are derived. If the sinusoidal functions comprise different frequencies, intermodulation distortion products are also generated.

In summary, the RF power supplies connected to a plasma chamber can be varied to control to ion energy, where the ion voltage is generated by the squaring of the sheath modulation. As a result, harmonic emissions from the ion voltages are generated. The harmonic quantities provide a feedback mechanism of the ion energy is formed.

As will be described in greater detail, the system examines the RF spectrum emitted from the sheath. From the RF spectrum, the signal characteristics, such as magnitude and phase, are determined from the harmonic and intermodulation distortion products to characterize the sheath voltage and the ion energies to be controlled. From the signal characteristics, the condition of the ion energy distribution function (IED) is determined, and the RF power delivery system is controlled to achieve a desired IEDF result. Control of the RF power delivery system thus varies in accordance with the RF spectrum emissions.

In various embodiments described herein, one embodiment addresses an inductively coupled plasma (ICP) source example with RF power coupled at the same frequency driven at the source and bias electrodes. In various embodiments, capacitively coupled plasma (CCP) has a source RF power coupled with the bias power supply to mix a set of frequencies. In various embodiments, the ion energy distribution function can be positively influenced by power control and bias to source phase control directed by feedback derived from spectral harmonic emission. In various embodiments, a harmonically related RF power delivery system coupled to a bias electrode provides controllability of the ion energy distribution function from sheath voltage emissions of harmonic and intermodulation distortion products.

FIGS. 5-8 depict plots of the sheath modulation and ion voltage as a function of the interaction between the source RF power supplies and the bias RF power supply, such as in between RF power supplies 20, 22 (considered source supplies) and RF power supply 28 (considered a bias supply) of an ICP system, such as shown in FIG. 1. In this particular example, the frequency and phase of RF power supplies 20, 22 are locked. In this particular example, the frequency of power supplies 20, 22, 28 is 13.56 MHz. Also, in this example, the phase between the RF signals output by source RF power supplies 20, 22 and the bias power supply 28 is varied. The current output by source RF power supplies 20, 22 is held constant.

Figure 5:
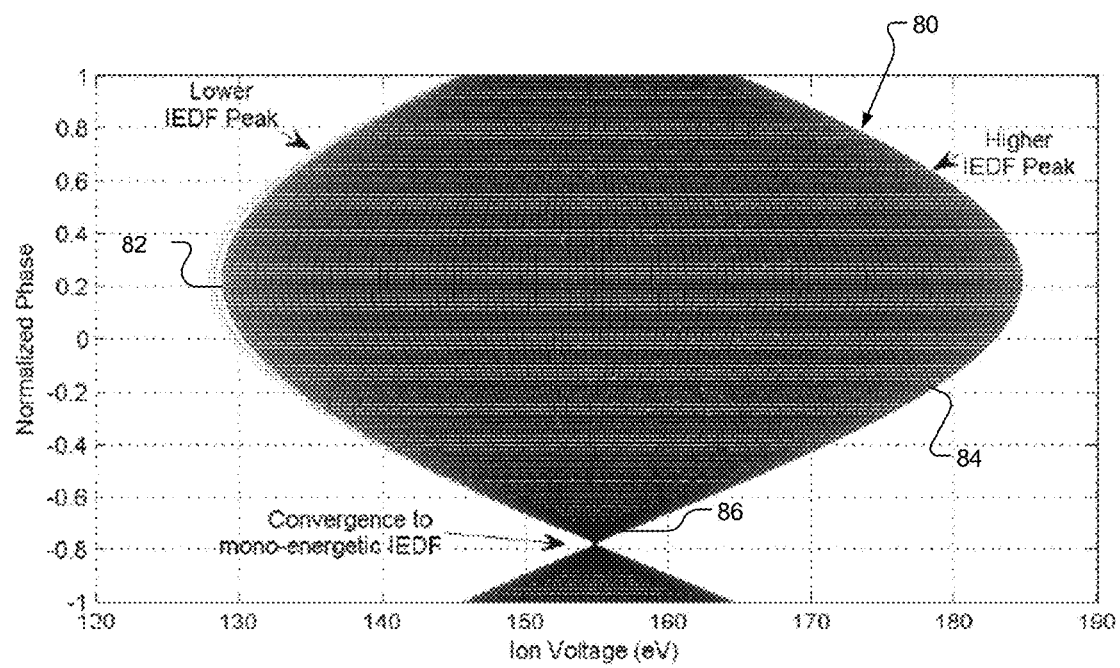
FIG. 5 depicts a two-dimensional plot of ion voltage versus normalized phase for a particular implementation of the plasma system of FIG. 3.
Figure 6:
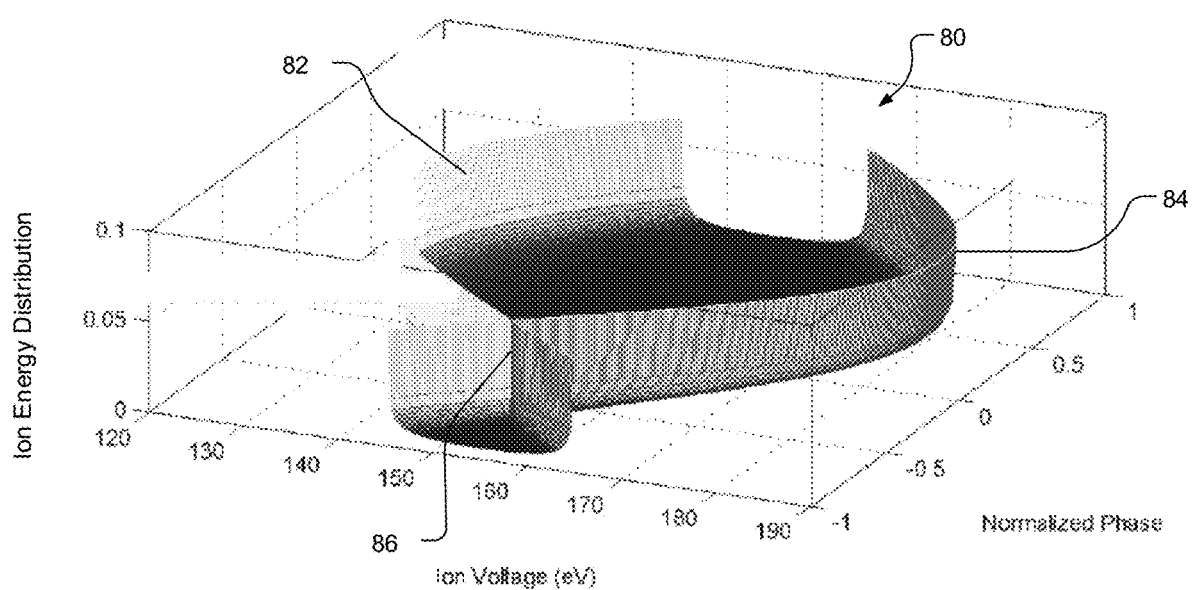
FIG. 6 depicts a three-dimensional plot of ion voltage versus normalized phase versus ion energy distribution for a particular implementation of the plasma system of FIG. 3.

FIGS. 5 and 6 depict an IEDF waveform 80 as a function of the ion voltage and the phase, shown as normalized in the plots. FIG. 5 is a two-dimensional representation of the IEDF plot, and FIG. 6 is a three-dimensional representation of the IEDF plot. Thus, FIG. 5 also shows the magnitude of the IEDF. The x-axes of FIGS. 5 and 6 represent the ion voltage in electron volts (eV), the y-axes represent the bias phase, which is normalized for the voltage applied to the bias, and the z-axes represent the IEDF. As can be seen in FIGS. 5 and 6. with the phase between the source RF power supplies 20, 22 and the bias RF power supplies 28 (the bias phase) near 1, there are two distinct peaks that are noted as lower peak 82 and higher peak 84. As best seen in FIG. 6, the peaks are at the periphery of the IEDF. As the bias phase is reduced, the peaks widen, with a maximum width at an approximate bias phase of 0.2, and then begin to converge. At a bias phase of approximately −0.8, the lower and higher peaks meet to form a mono-energetic peak 86. As the bias phase continues to reduce, the single peak begins to diverge back to the two individual peaks.

Figure 7:
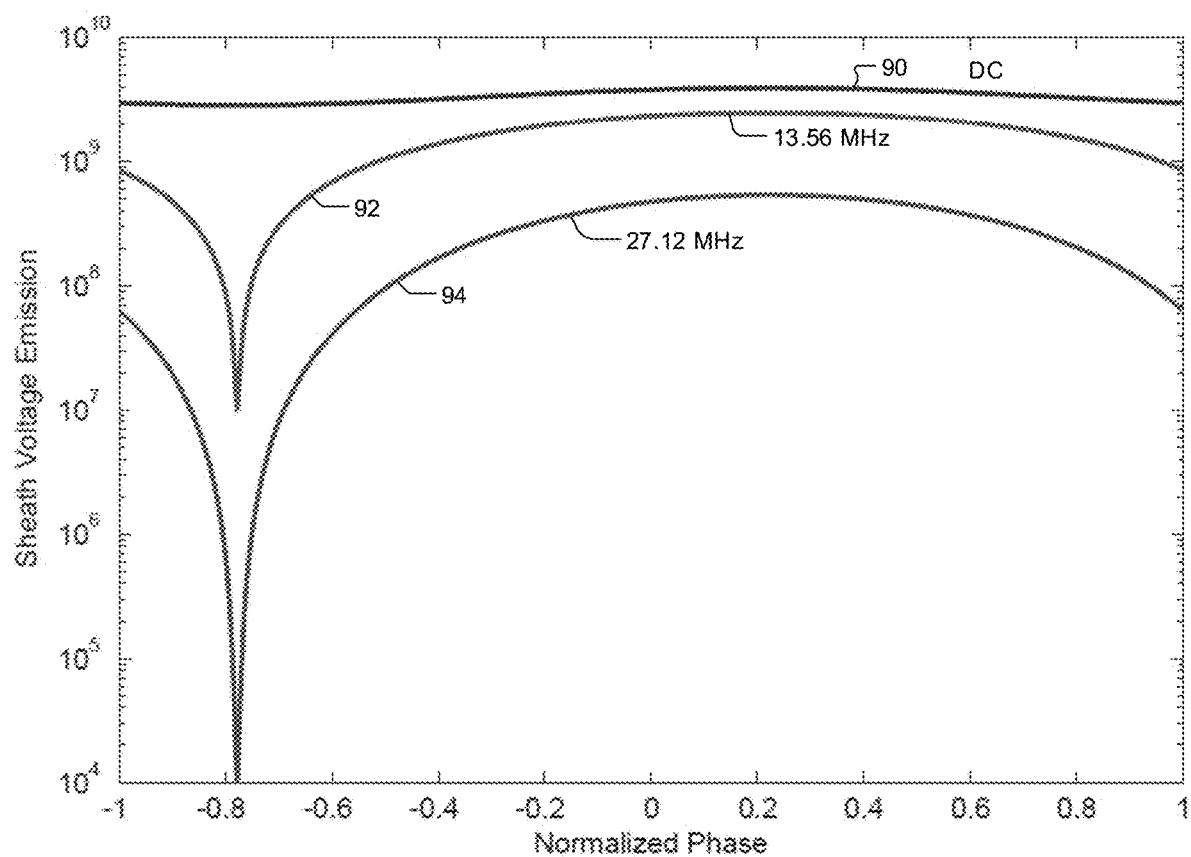
FIG. 7 depicts a plot of normalized phase versus sheath voltage emissions at a base frequency and a second harmonic of the base frequency for a particular implementation of the plasma system of FIG. 3.

FIG. 7 depicts waveforms of the sheath voltage emission at a direct current (DC) 90, a frequency of 13.56 MHz 92, and at a frequency of 27.12 MHz 94. The frequency of 27.12 MHz is a second harmonic of the frequency of 13.56 MHz. In FIG. 7, the x-axis represents the normalized phase, and the y-axis represents the emissions from the plasma chamber, such as plasma chamber 12 of FIG. 1. As can be seen, the 13.56 MHz and 27.12 MHz voltage signals correspond to the width of the IEDF, and the minimum of these signals coincide with the mono-energetic IEDF peak 86 of FIG. 6 at a phase of −0.8.

Figure 8:
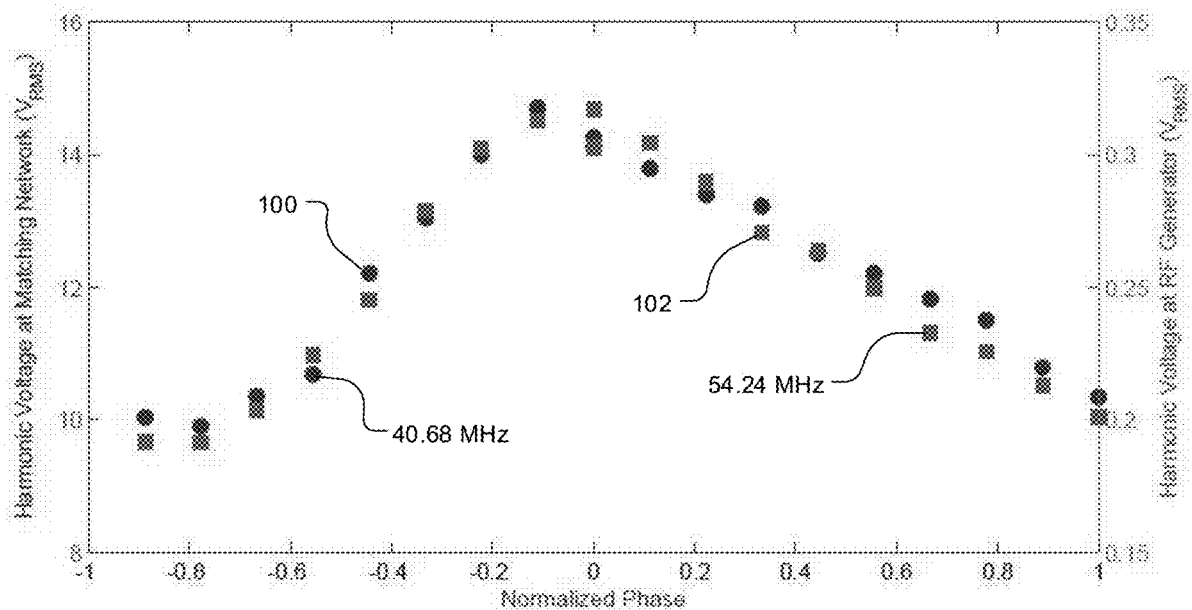
FIG. 8 depicts a plot of normalized phase versus a harmonic voltage measured at two different locations in a plasma drive system for a particular implementation of the plasma system of FIG. 3.

FIG. 8 depicts plots of the normalized phase along the x-axis versus the harmonic voltage measured at a matching network and plotted along the left y-axis and the harmonic voltage measured at the RF generator plotted along the right y-axis. Waveform 100, represented by circles, corresponds to the harmonic voltage at the matching network, and waveform 102, represented by squares, corresponds to the harmonic voltage at the RF generator. The harmonic voltage may be measured using the voltage/current probe. More specifically, the harmonic voltage at the matching network may be measured by placing a VI probe between the output of the matching network and the bias electrode. Similarly, the harmonic voltage of the RF generator may be measured by placing a VI probe between the output of the RF generator and a matching network associated with the bias electrode.

With the source RF power supplies 20, 22 and bias RF power supply 28 frequency and phase locked, incremental variation of the bias phase indicates that as the lower and higher peaks of the IEDF converged to form a single mono-energetic peak as shown in FIGS. 5 and 6, the second harmonic voltages in FIG. 8 both reach a minimum. The minimum of the 27.12 MHz voltage signal 94 of FIG. 7 corresponds to the minimum width of the IEDF at an approximate phase angle of −0.8. The measured harmonic signals at both the RF generator and the matching network agree with the phase measurement required for a mono-energetic IEDF peak.

In the RF power delivery system described above with respect to FIGS. 1 and 5-8, examination of the RF spectrum enables varying control of the RF power delivery system to achieve a desired IEDF. In the system as described above with respect to FIGS. 1 and 5-8 (sometimes referred to as a triplet of RF power supplies), the two peaks 82, 84 in the ion energy distribution (IED) are controlled by varying the relative phase between the bias to source power supplies. Further, a mono-energetic ion energy distribution function occurs at a particular bias-source phase relationship. The mono-energetic condition is detected by a minimum value in the second harmonic emission, as indicated by waveform 94 of FIG. 7.

The discussion above with respect to FIGS. 1 and 5-8 describes a triplet system. In a triplet system, the two RF power supplies and the RF bias power supply operate at the same frequency, and the two RF source power supplies and the RF bias power supply operate at a relative phase that is varied. Another approach to driving the source RF power supply and the bias RF power supply utilizes operating one of the source or bias RF power supplies at a first frequency and operating the other of the source or bias RF power supplies at a second frequency that is a harmonic of the first frequency. Such a configuration can be referred to as a harmonic drive plasma system and may be seen in connection with operating a CCP plasma system 30, such as in FIG. 2. From the sheath modulation function and the corresponding ion voltage, which is impacted by the sheath voltage, the phase adjustment can control the peak of the ion energy distribution function in a harmonic drive plasma system.

Figure 9:
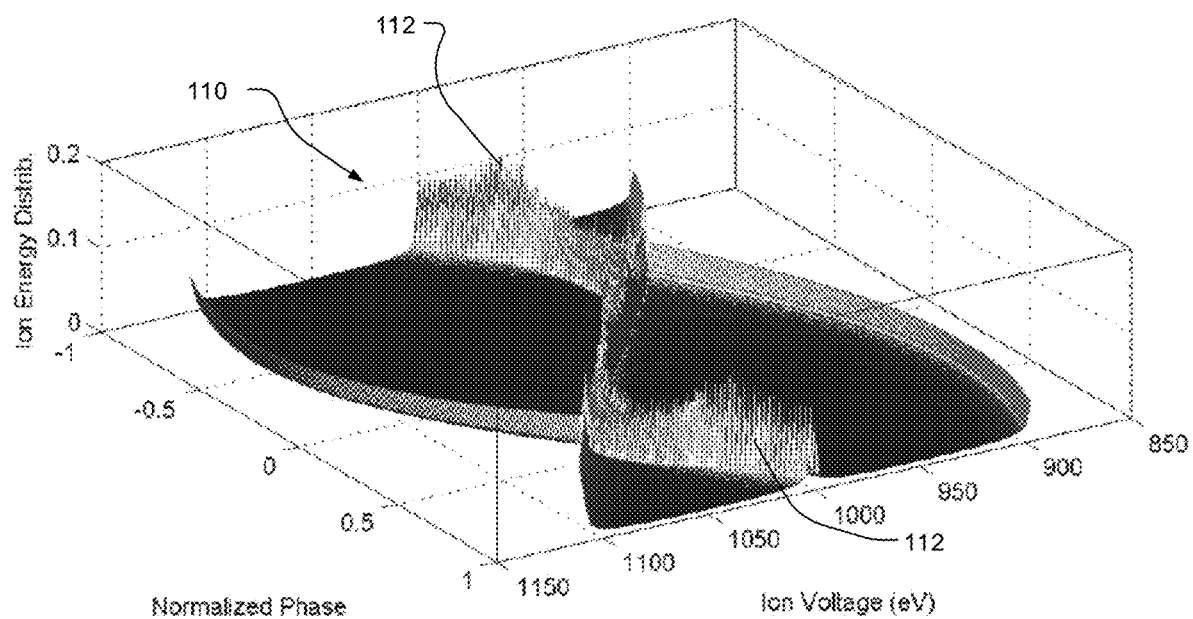
FIG. 9 depicts a three-dimensional plot of ion voltage versus normalized phase versus ion energy distribution for a particular implementation of the plasma system of FIG. 4.

By way of example and with reference to FIG. 2, RF power supply 42 may be assigned as the bias electrode and driven at a frequency of 13.56 MHz. Power source 40 of FIG. 2 may be assigned as the source electrode and driven at a frequency of 27.12 MHz. FIG. 9 depicts an IEDF waveform 110 in a three-dimensional graph, with normalized phase plotted along one axis, ion voltage in electron volts plotted along a second axis, and ion energy distribution (IED) plotted on a third axis. As can be seen from FIG. 9, the skew of the IEDF peak is linear with respect to the relative phase between the RF power supplies 40, 42. Further, the IEDF peak 112 is periodic with normalized phase.

Figure 10:
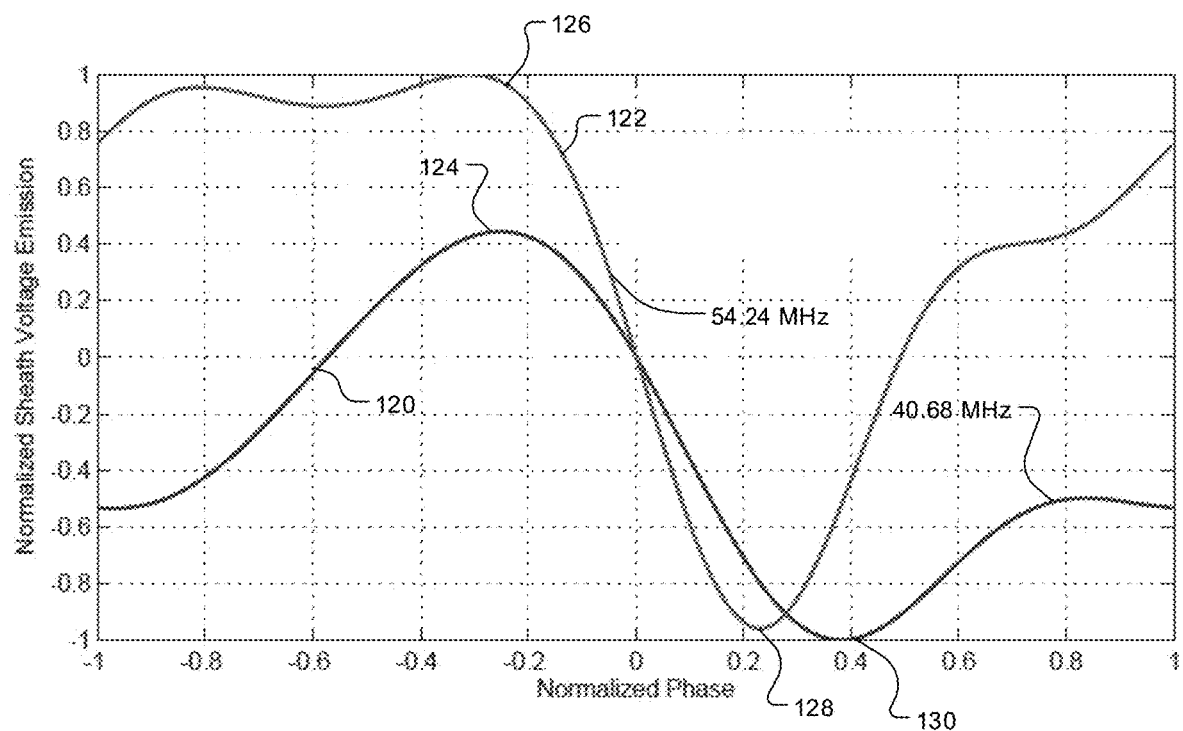
FIG. 10 depicts a plot of normalized phase versus sheath voltage emissions for a harmonic and intermodulation distortion frequency of a base drive signal for a particular implementation of the plasma system of FIG. 4.

FIG. 10 depicts a plot of the voltage emission from a plasma chamber 34 of FIG. 2 relative to a normalized phase. FIG. 10 depicts waveforms of normalized phase versus normalized sheath voltage emission at an IMD frequency (waveform 120) and a second harmonic frequency (waveform 122). That is, the IMD is 40.68 MHz (13.56 MHz (bias power supply frequency) +27.12 MHz (source power supply 42 frequency)). The second harmonic is 54.24 MHz (2×27.12 MHz). At a normalized phase of 0, the waveforms of FIG. 10 span to a maximum and minimum as the phase varies. The maximum peaks 124, 126 of the respective voltage waveforms 120, 122 are located at a normalized phase of −0.3, and the minimum peaks 128, 130 of the respective voltage waveforms 120, 122 are approximately collocated at a normalized phase of 0.3. As it relates to the IEDF plot in FIG. 9, the voltage peaks correspond to the linear ion voltage range of the single IEDF peak. By knowing the peaks of the voltage emissions of FIG. 10, the linear range of the IEDF peak of FIG. 9 is determined. With knowledge of the peak IEDF, the skew of the ion energies can be controlled by varying the relative phase of the harmonic driven RF power delivery system.

Regardless of whether the drive system is a triplet drive system or a harmonic drive system, the foregoing provides the flexibility to control the IEDF and the IED peak from the RF spectrum emissions. In a triplet coupled RF power delivery system, such as generally described in FIGS. 1 and 5-8, determining a minimum voltage from a harmonic emission enables convergence to a single IEDF. For a harmonic derived RF power delivery system, such as generally described in FIGS. 2, 9, and 10, peaks detected from spectrum emissions provide a linear relationship between the relative phases of the RF signals to the IEDF peak. Thus, the embodiments described herein provide the ability to (1) determine the peak of the ion energy distribution; and (2) subsequently control the ion energy of the distribution peak.

Figure 11:
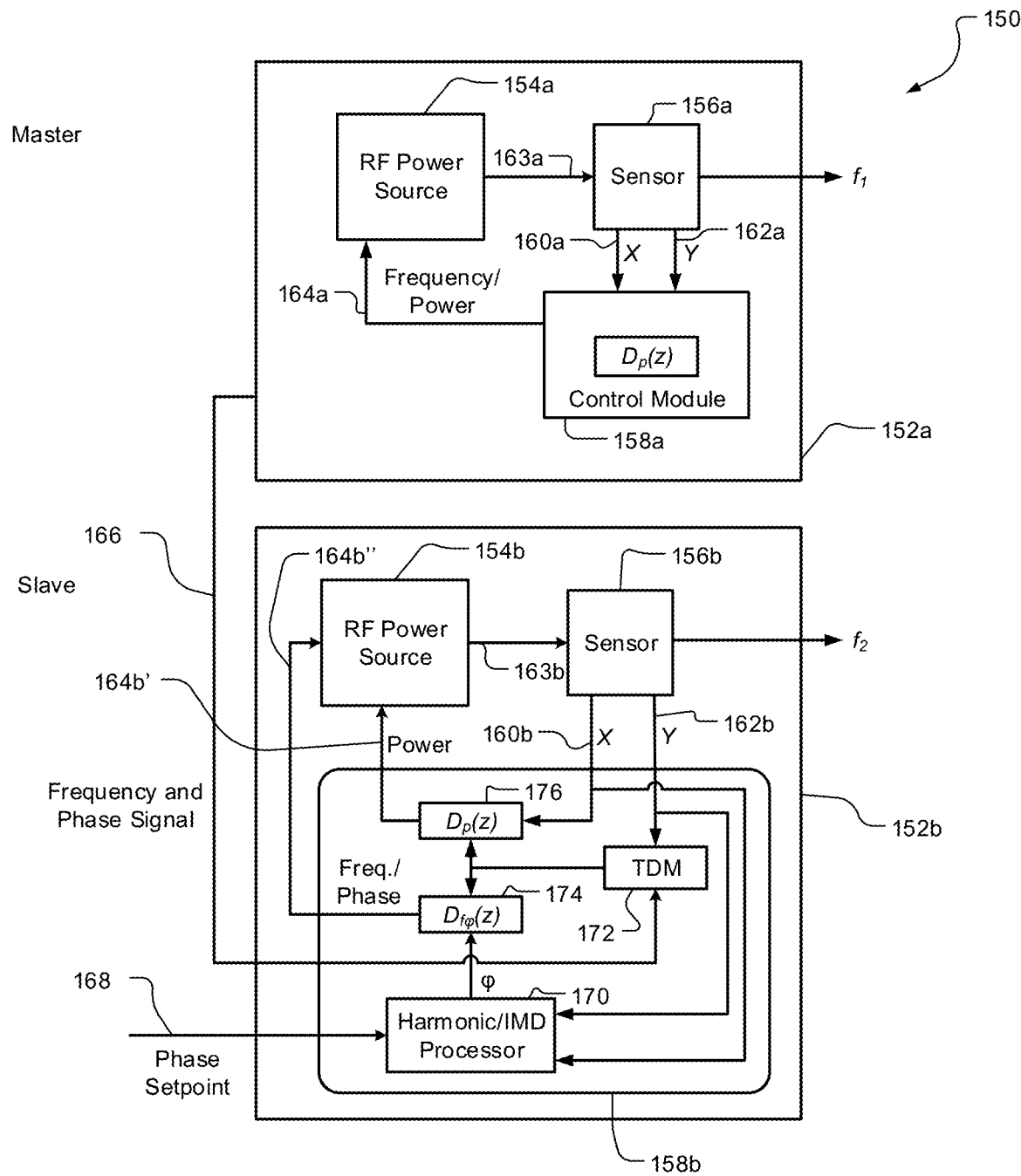
FIG. 11 depicts a block diagram of a RF control system arranged according to the principles of the present disclosure.

FIG. 11 depicts a RF generator or power supply system 150 including a pair of radio frequency (RF) generators or power supplies 152a, 152b for driving a load (not shown). RF generators 152a, 152b can implement a master-and-slave configuration using a control signal, as will be described in greater detail. RF generator 152a is designated the master, and RF generator 152b is designated the slave. In various embodiments, power (either voltage or current), frequency, and phase of RF generator 152b may be slaved to the frequency of RF generator 152a using a control signal sent from RF generator 152a to RF generator 152b. In various embodiments, the frequency signal output by RF generator 152a can be determined in accordance with the spectral emissions sample from a load, such as a plasma chamber. When the control signal is absent from RF generator 152a, RF generators 152a and 152b can operate autonomously. U.S. Pat. Nos. 7,602,127; 8,110,991; and 8,395,322; referenced above and incorporated herein, describes operation of a dual power supply system in a master/slave relationship.

RF generators 152a, 152b include respective RF power sources or amplifiers 154a, 154b, RF sensors 156a, 156b, and processors, controllers, or control modules 158a, 158b. RF power sources 154a, 154b generate RF power signals 163a, 163b output to respective sensors 156a, 156b. Sensor 156a, 156b receive the output of sources 154a, 154b and generate respective RF power signals $f_1$ and $f_2$ and also output signals that vary in accordance with spectral emissions received from a load, such as a plasma chamber. While sensors 156a, 156b, are shown with respective RF generators 152a, 152b, it should be noted that spectrum sampling of an RF sensor can occur externally to the RF power generators 152a, 152b. Such external sensing can occur at the output of the RF generator, at the input of the impedance matching device that is located between the RF generator and the plasma chamber, or between the output of the impedance matching circuit (including, inside the impedance matching device) and the plasma chamber.

Sensors 156a, 156b detect the spectral emissions from a load (not shown), such as a plasma chamber, and output signals X and Y. Sensors 156a, 156b may include voltage, current, and/or directional coupler sensors. Sensors 156a, 156b may detect (i) voltage V and current I output from power amplifier 154a, 154b, and/or (ii) forward (or source) power $P_{FWD}$ output from respective power amplifiers 154a, 154b and/or RF generators 150a, 150b and reverse (or reflected) power $P_{REV}$ received from a matching network or a load connected to respective sensor 156a, 165b. The voltage V, current I, forward power $P_{FWD}$, and reverse power $P_{REV}$ may be scaled and/or filtered versions of the actual voltage, current, forward power, and reverse power associated with the respective power sources 154a, 154b. Sensors 156a, 156b may be analog and/or digital sensors. In a digital implementation, the sensors 156a, 156b may include analog-to-digital (ND) converters and signal sampling components with corresponding sampling rates. Signals X and Y can represent any of the voltage V and current I or forward (or source) power $P_{FWD}$ reverse (or reflected) power $P_{REV}$.

Sensors 156a, 156b generate sensor signals X, Y, which are received by respective controllers or power control modules 158a, 158b. Power control modules 158a, 158b process the respective X, Y signals 160a, 162a and 160b, 162b and generate one or a plurality of feedback control signals to respective power sources 154a, 154b. Power amplifiers 154a, 154b adjust the RF power signal 163a, 163b based on the received feedback control signal. Power control modules 158a, 158b may include at least, proportional integral derivative (PID) controllers or subsets thereof and/or direct digital synthesis (DDS) component(s) and/or any of the various components described below in connection with the term modules. In various embodiments, power control modules 158a, 158b are first PID controllers or subsets and may include a functions, processes, processors, submodules or modules identified as $D_p(z)$. $D_p(z)$ is implemented in any one of the module variations described below. Feedback control signals 164a, 164b may be drive signals and have a DC offset or rail voltage, voltage or current magnitude, a frequency, and a phase.

Control module 158a of RF power supply 152a applies control function $D_p(z)$ to the received signals X, Y and generates feedback control signal 164a. Feedback control signal 164a includes both frequency and power control components for controlling RF power source 154a. Thus, RF power source 154a generates RF power signal 163a in accordance with frequency and power information communicated in feedback control signal 164a. The power information communicated in feedback control signal 164a can include voltage and/or current information. Control module 158a also generates a frequency and phase information signal 166 input to control module 158b of RF generator 152b. Frequency and phase information signal 166 includes frequency information, including the frequency of $f_1$ and the phase of $f_1$.

In various embodiments, slave RF generator 152b regulates the output phase of $f_2$ relative to the input frequency and phase information signal 166, and thus $f_1$ output by RF generator 152a for a particular phase set point. Frequency and phase information signal 166 contains information about the phase and frequency of $f_1$. Control module 158b of RF power supply 152b, in addition to receiving signals X, Y from sensor 156b also receives frequency and phase information signal 166 from RF generator 152a and a phase setpoint signal 168 and applies functions, processes, processors, submodules, or modules $D_p(z)$ and $D_{f\phi}(z)$ to generate one or a pair of respective feedback control signals 164b', 164b''.

Control module 158b includes harmonic/IMD processor or module 170 and time division multiplexer or multiplexing module 172. Control modules 158a, 158b, harmonic/IMD processor or module 170, and multiplexing module 172 are implemented in any one of the module variations described below. Control module 158b includes harmonic/IMD module 170, which is coupled to the sensor 156b to receive signals X, Y. Harmonic/IMD module 170 also receives phase and frequency signal 166. Harmonic/IMD module 170 generates a phase setting to digital control function $D_{f\phi}(z)$. The phase setting $\phi$ defines a phase, and $D_{f\phi}(Z)$ determines a phase and frequency of operation for RF power source 154b in accordance with $\phi$. $D_{f\phi}$ is implemented in any one of the module variations described below. In a first mode of operation, harmonic/IMD module 170 generates the phase setting $\phi$ in accordance with the phase setpoint signal 168, which is received from an external source, such as an external controller. The first mode of operation may be referred to as a bypass mode of operation and may be operational when harmonic/IMD module 170 is disabled.

In the second mode of operation, such as when harmonic/IMD module 170 is enabled, harmonic/IMD module 170 generates the phase setting in accordance with output signals X, Y and the information contained in frequency and phase information signal 166. Phase setting $\phi$ is determined in accordance with the sampled spectral emissions at the output of the RF sensor 156b. The phase setting $\varphi$ thus determined in accordance with the approaches descried in connection with FIGS. 1-10. That is, a phase is determined in connection with one or both minimizing a harmonic of the source or the bias signal and the harmonic and the IMD of the source or bias signals.

The spectral emissions can be determined in either the frequency-domain or the time-domain. For frequency domain processing, the Fast Fourier Transform (FFT) or wavelet transform can be applied to obtain from the RF sensor signals X, Y information from the frequency or frequencies of interest. For time domain processing, analog or digital forms of heterodyning and associated filtering are suitable approaches to extract a specific frequency.

The control function $D_{f\phi}(Z)$ receives the phase setting and generates a frequency and phase feedback control signal $164b''$ to power amplifier $154b$. Control function $D_{f\phi}(z)$ also receives frequency and phase information from RF generator $152a$ via frequency and phase information signal $166$. Control function $D_{f\phi}(z)$ generates the frequency and phase control signal $164b''$ to power source $154b$ to vary the skew parameter of the sheath modulation function, to thereby control the peak of the IEDF. $D_{f\phi}(z)$ thus frequency and phase locks the signal from RF power source $154b$ with the signal from RF power source $154a$.

Frequency and phase information signal $166$ is input to time division multiplexer (TDM) $172$. TDM $172$ multiplexes information contained within frequency and phase information signal $166$ and signal information from signal Y output by sensor $156b$. In various embodiments, the signal Y input to TDM can be either voltage or current. TDM $172$ multiplexes the signal $166$ and the Y output from sensor $156b$ and applies the multiplexed output to control function $D_{f\phi}(z)$ and control function $D_p(z)$.

Figure 13:
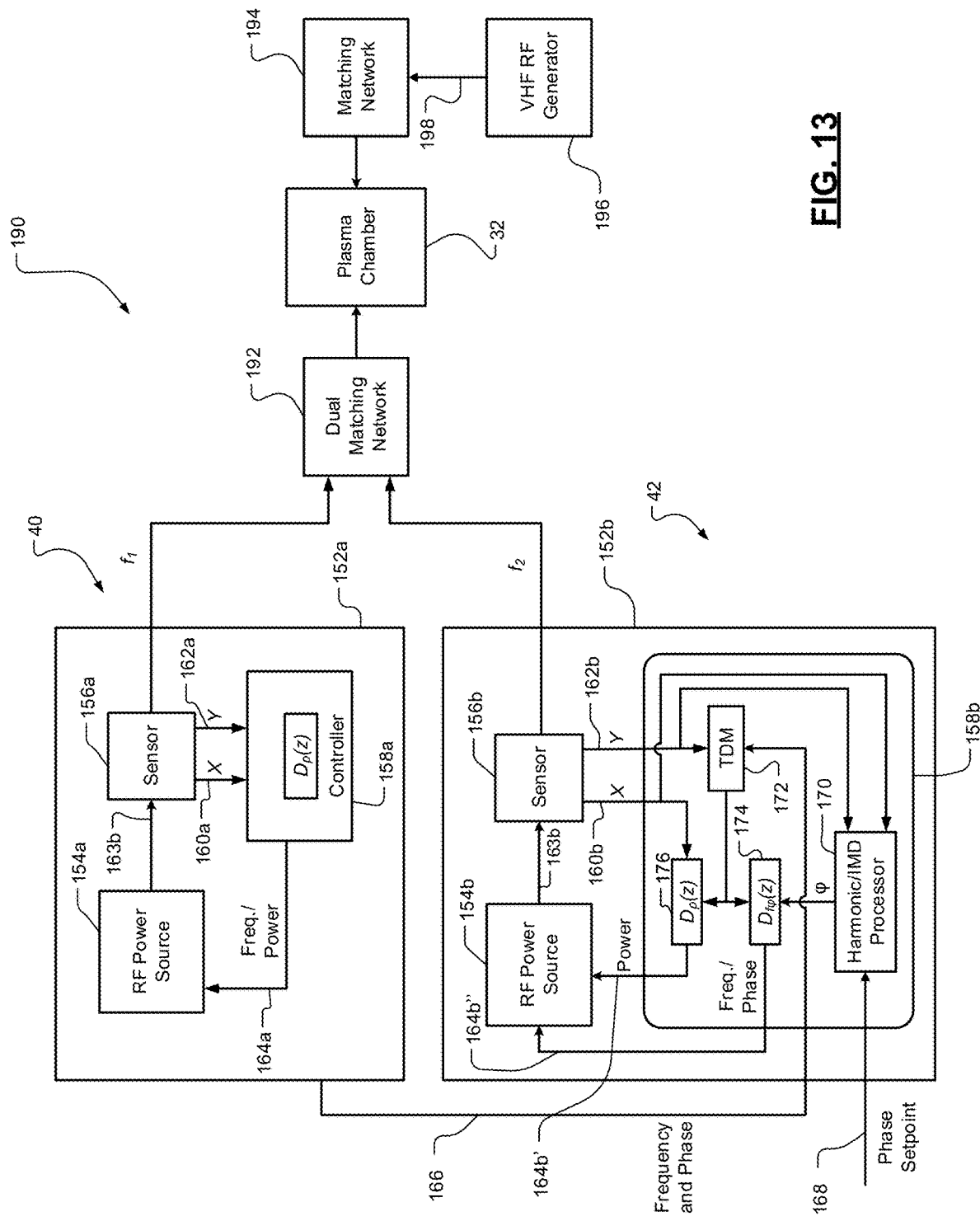
FIG. 13 is a block diagram of a RF control system of the present disclosure implemented on a CCP system.

Control function $D_p(z)$ receives the frequency and phase information signal $166$ from RF generator $152a$ and one of the X or Y signals from sensor $165b$ via TDM $172$. In the embodiment of FIG. 13, TDM $172$ receives the Y signal from sensor $156b$. Control function $D_p(z)$ also receives the other of the signals X, Y output form sensor $156b$. Thus, control function $D_p(z)$ $176$ of control module $158b$ receives frequency and phase information signal $166$, and the X, Y signals from sensor $156b$. Control function $D_p(z)$ generates a power signal $164b'$ output to RF source $154b$, in accordance with the received frequency, X, and Y signals. RF source $154b$ generates RF power signal $163b$. Control function $D_p(z)$ of control module $158b$ thus generates a power signal to control the width parameter of the sheath oscillation amplitude and, therefore, the width of the IDEF, as described above with respect to FIGS. 1-10.

For either frequency or time-domain processing, the objective is to extract from the X, Y signals output by sensor $156a$, $156b$ the signals related to the sheath voltage emissions. The sheath voltage emission signals have known frequency details. In various embodiments, such as the triplet power supply configuration discussed in connection with FIGS. 1 and 5-8, the second harmonic was sampled, 27.12 MHz in one particular example. In the case of the harmonic drive frequency scheme discussed in connection with FIGS. 2, 9, and 10, the intermodulation distortion product (IMD), 40.68 MHz in one particular example, and the second harmonic, 54.24 MHz in one particular example, contain the necessary signal details to determine information related to the peak location of the ion energy distribution and to enable adjusting the operating parameters of RF power source $154b$ to yield a peak at a particular ion energy. Thus, the harmonic/IMD module $170$ extracts signal information from the sampled RF sensor spectrum provided in signals X, Y output by sensor $156b$ as it relates to the sheath voltage emission. In various embodiments described above, the voltage signal at a harmonic of one of the RF power sources $154a$, $154b$ or the first order intermodulation product ($f_2-f_1$) identifies the peak location of the ion energy distribution. Once the peak location of the IEDF is determined by harmonic/IMD module $170$, the IEDF peak location (the skew) can be adjusted to a desired position in the IEDF.

In various embodiments, the RF generators $152a$, $152b$ of FIG. 11 may be individually configured as described above or may be identically configured to effect examining spectral emissions and adjusting frequency, power and phase accordingly. In a substantially similar configuration, RF generator $152a$ may be arranged as described in generator $152b$. Further, in various embodiments, if configured similarly, RF generator $152b$ may be configured as a master in the RF generator configuration and output a control signal to a slave RF generator $152a$.

Figure 12:
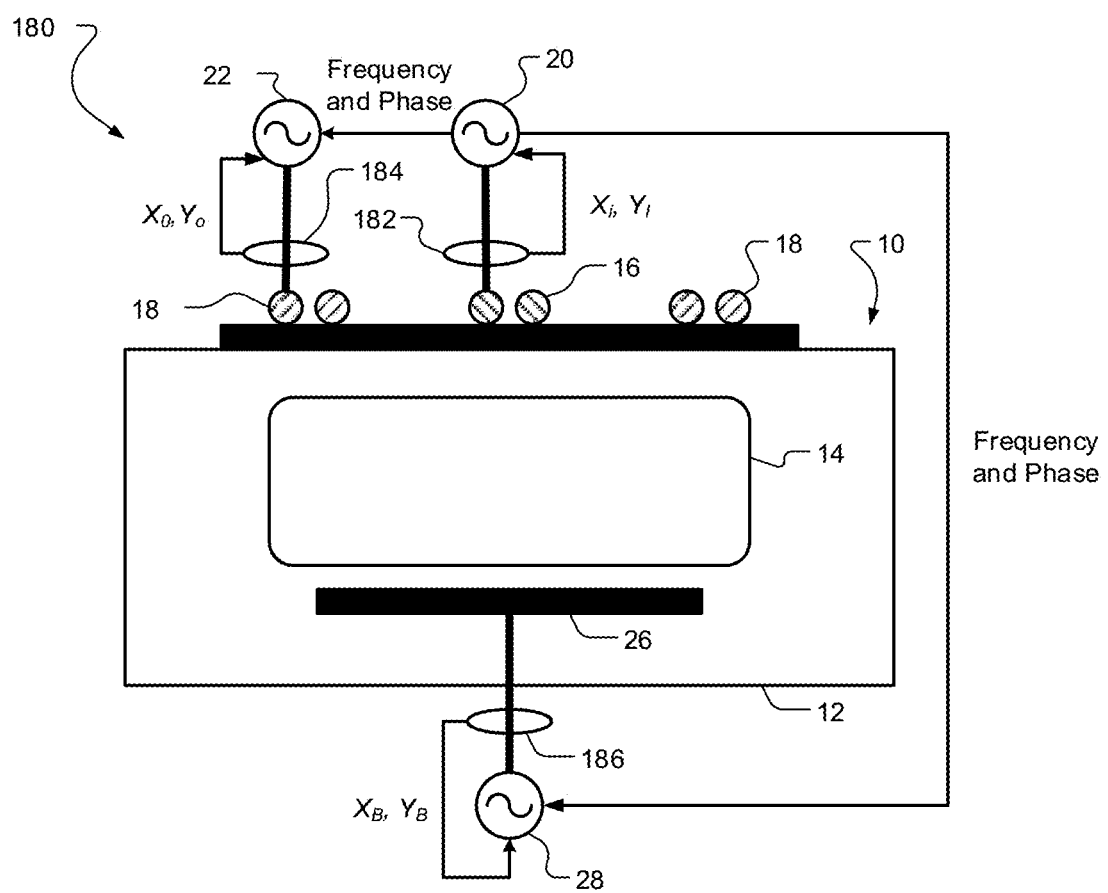
FIG. 12 is a block diagram of a RF control system of the present disclosure implemented on an ICP system.

Various embodiments can include the RF power delivery system described above coupled to plasma chambers. FIG. 12 depicts various embodiments of an ICP system $180$ utilizing a configuration of the RF generators described above with respect to FIG. 11 providing power to a plasma chamber $12$ such as shown in the ICP system $10$ of FIG. 1. In FIG. 12, similar components from FIG. 1 will be referred to using the same reference numerals, and the description of such similar components may be augmented or distinguished as necessary. In addition to components similar to that described in FIG. 1, FIG. 12 also includes a trio of sensors $182$, $184$, $186$. Sensors $182$, $184$, $186$ are associated with a respective RF generator $20$, $22$, $28$ and provide the X, Y inputs to respective RF generator $20$, $22$, $28$.

With reference to FIGS. 11 and 12, RF generators $20$, $22$ operate analogously to the master slave relationship defined in U.S. Pat. Nos. 7,602,127, 8,110,991, and 8,395,322, and incorporated herein. RF generator $20$ operates as a master RF generator for each of RF generator $22$ and RF generator $28$. With respect to RF generator $22$, RF generator $20$ outputs a frequency and phase signal to RF generator $22$, and RF generator $22$ operates as a slave generator in the context discussed in the above-referenced U.S. patents. RF generator $20$ outputs a phase and frequency information signal to RF generator $28$, which operates as a slave in the context discussed with respect to FIG. 11.

In various embodiments of the ICP system $180$, the bias RF generator $28$ is frequency and phase locked to the RF generators $20$, $22$, where RF power supply $20$ acts as a master for both RF generator $20$ and RF generator $28$. In the configuration of ICP system $180$, the spectrum sampling occurs at the bias RF generator $28$. RF generator $28$ is configured similarly to RF generator $152b$ of FIG. 11. Bias RF generator $28$ includes a harmonic/IMD module $170$ that inspects the sampled bias signals at the respective harmonics $X_B$, $Y_B$ to adjust the relative phase between the bias RF generator $28$ and the source RF generator $20$. Adjusting the phase of RF generator $28$ relative to the frequency and phase signal received from RF generator $20$ provides control of the peak location within the ion energy distribution.

FIG. 13 depicts various embodiments of a CCP system $190$ utilizing a similar configuration the RF generators described above with respect to FIG. 2 for providing power to a plasma chamber $32$ such as described in the plasma system $30$ of FIG. 2. In FIG. 13, similar components of FIG. 1 will be referred to using the same reference numerals, and the description of such similar components may be augmented or distinguished as necessary. RF generator $40$ of FIG. 2 is implemented in a configuration similar to RF generator 152a of FIG. 11, and RF power source 42 is implemented in a configuration similar to RF generator 152b of FIG. 11.

As described above with respect FIG. 2, RF generators 40, 42 can be connected to a common electrode, such as electrode 36, 38, and the other of the two electrodes 36, 38 can be connected to ground or to yet a third RF generator. FIG. 13 also includes a pair of matching networks 192, 194. Matching network 192 is configured as a dual matching network that receives frequency signals $f_1$ and $f_2$ and provides appropriate impedance matching for each RF generator 40, 42. Dual matching network 192 can be alternately implemented as individual networks, each providing an appropriate impedance match for each of respective RF generators 40, 42. CCP system 190 also includes a very high frequency (VHF) RF generator or source 196. In various embodiments, VHF RF generator 196 provides a RF signal to the other of the two electrodes 36, 38 of plasma chamber 32. VHF RF generator 196 provides a VHF RF power signal 198 to matching network 194. Matching network 194 provides an impedance match between VHF RF generator 196 and plasma chamber 32. In various embodiments, RF generators 40, 42 apply power to a bias electrode, and VHF RF generator 186 provides power to a source electrode. Thus, for the CCP system in FIG. 13, the bias is powered by two RF generators 40, 42 that are harmonically related in phase and frequency locked using the approach discussed with respect to FIGS. 2, 8, and 9

Figure 14:
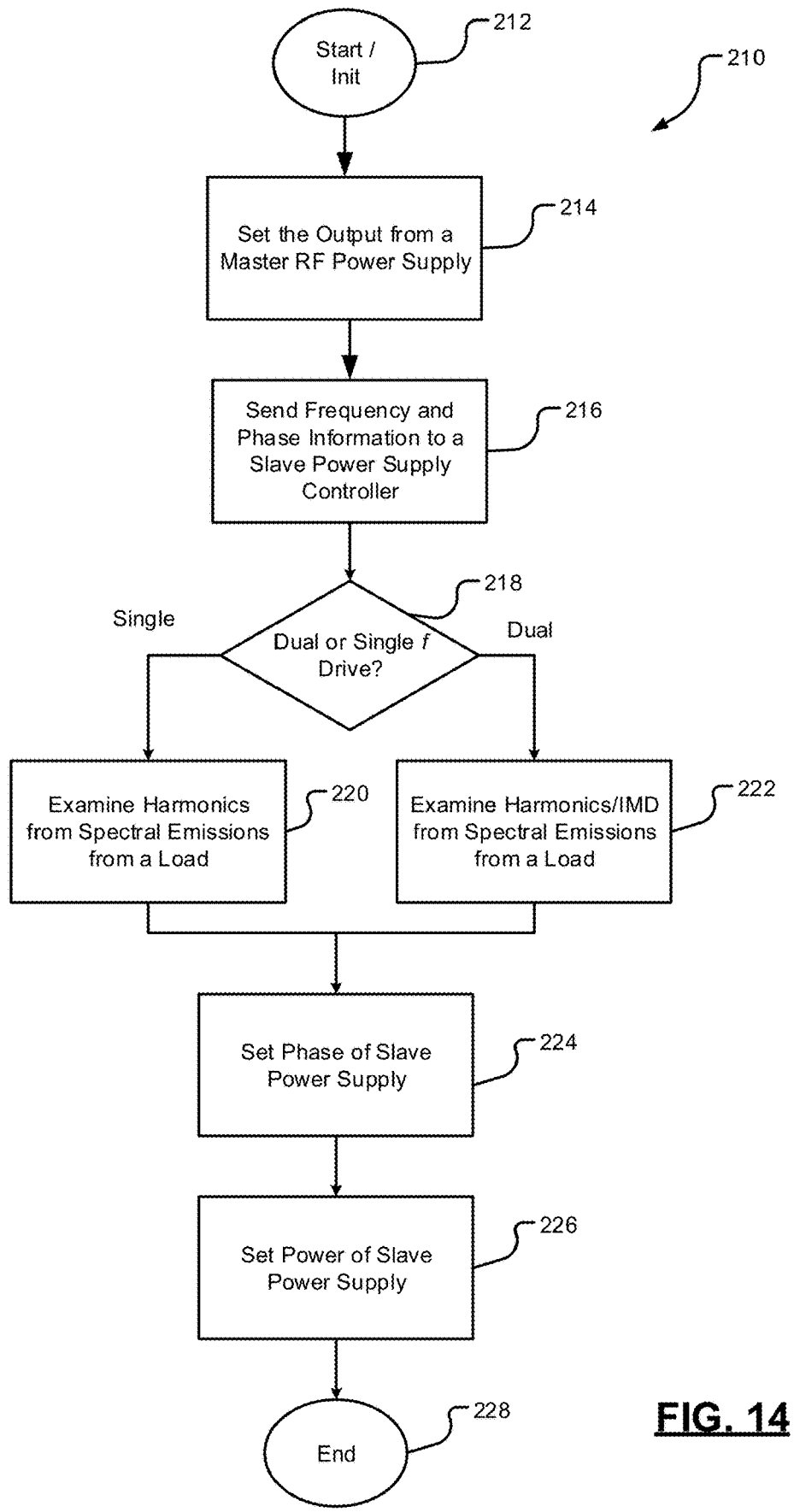
FIG. 14 is flow diagram of a method for tailoring an RF waveform for ion energy distribution.

FIG. 14 depicts a flow diagram for a method of feedback control for RF waveform tailoring for ion energy distribution 210 according to various embodiments. At block 212, control begins and various parameters are initialized. At block 214, a frequency of a master RF power supply is set, such as at a frequency $f_1$ having a phase. In various embodiments, the frequency $f_1$ is output to a load, such as a plasma chamber described above. Control next proceeds to block 216 in which a signal having frequency and phase information is sent to a controller for a slave power supply. At decision block to 218, it is determined whether the master and slave power supplies are operated at substantially the same frequency, such as the ICP system discussed above, or at a dual frequency, such as in the CCP system discussed above. It should be noted that block 218 is considered optional to the extent that it is not necessary if it has already been determined whether the master and slave are driven at substantially the same or different frequencies. Block 218 is, therefore, included to facilitate the understanding of the spectral emissions that are examined depending upon the frequencies at which the master and slave power supplies are operated.

If the master and slave power supplies operate at substantially the same frequency, control proceeds to block 220 in which the harmonics contained within the spectral emissions from a load are examined and a target phase is determined. If the master and slave power supplies operate at different frequencies, control proceeds to block 222 in which the harmonics and IMD contained within the spectral emissions from a load are examined and a target phase is determined. In various embodiments, the target phase determines a peak in the IED. In either of blocks 220 or 222, a target phase is determined, and control proceeds to block 224. A block 224, the phase and frequency of the slave power supply is set in accordance with the target phase. Control next proceeds to block 226 in which the power of the slave power supply is also determined in accordance with the output from blocks 220 or 222. In various embodiments, the power set by the slave determines a width of the IED.

In various embodiments, it may be desirable to pulse the slave RF generator 152b in order to vary the ion voltage. That is, while in some embodiments it may be desirable to operate at a mono-energetic peak, such as peak 86 of FIG. 5, or at a particular position along the peak 112 of FIG. 9, other various plasma processes may benefit from operating away from the above-referenced peak. With reference to FIG. 5, operating at peak 86 provides an ion voltage of approximately 155 eV. There are times in a manufacturing process when it may be desirable to have more or less ion voltage. Ion voltage can be adjusted by operating at a phase away from −0.8 as shown in FIG. 5. For example, it is possible that the plasma operation would call for a less directed peak so that with reference to FIG. 5, if the phase is selected as 0.2, the ion voltage would be a composite of approximately 128 eV and 185 eV in accordance with the lower and upper peaks. In various embodiments, it may be desirable to pulse the phase between a phase to provide a mono-energetic peak 86 and a second phase that provides two peaks. In the example described above, the phase can alternate between −0.8 and 0.2.

With reference to FIG. 9, various plasma processes may benefit from varying the phase along a linear range of the peak 112. For example, the phase could be varied in the example of FIGS. 9 and 10 from the phase equal to 0.3 for a peak along the line of peaks defined by reference number 112. By varying the phase, a range of the ion voltages can be provided in a plasma system driven by the environment described in connection with FIGS. 9 and 10.

One benefit of identifying and controlling the location of the peak of the ion energy distribution is improved system phase control. For example, in a dual RF power delivery system operating in a conventional master-slave configuration where phase and frequency is locked without attention to the spectral emissions, at least three sources of systemic phase error exit. A first source exists between a control signal transmitted from the master to the slave; a second source exists between the output of the slave RF generator and the matching network to which it connects; and a third source exists in the matching network associated with the slave RF generator. The ion peak density control provided by the phase regulation of the present disclosure collectively address all three sources of phase error. The slave RF generator regulates the phase of the waveform output by the slave RF generator with respect to the phase of the frequency and phase signal input to slave RF generator.

Between the phase of the output of the slave RF power supply and the electrode to the plasma chamber, there are several systematic phase offsets, as described above. For the phase offset relative to the reference frequency signal input (that is, between the output of the master RF generator and the input to the slave RF generator), the cable coupling the master to the slave will have a length $L_1$, and velocity of propagation $V_{p1}$. Ignoring cable losses, the cable between the output of the master RF generator and the input to the slave RF generator will have a phase offset related by the transmission line parameters $L_1$ and $V_{p1}$ and expressed as $e^{j\phi_1}$. At the output of the slave RF power supply, two systemic phase offset contributors exist: (1) $e^{j\phi_2}$ characterizes the transmission line coupling the RF power from slave RF generator to its associated matching network, and (2) the phase $\phi_{MN}$ is associated with the transfer function for the matching network. Further, the power generator will have a varying phase output over the designed power range.

One approach to compensating for the phase offsets described above, which collectively characterize a systemic phase offset, requires measuring each contributing factor and apply a calibrated phase adjustment to the desired phase regulated at the output of slave RF generator. The calibrated phase adjustment must compensate for varying elements in the system, such as $\phi_{PA}$ and $\phi_{MN}$. The various embodiments described in the present disclosure avoid the inherent deficiencies of such a complex approach. The various embodiments of the present disclosure rely upon the spectral emissions of the RF harmonic parameter to compensate for systemic phase offsets. That is, relying upon the measured voltage from one or both of a harmonic or intermodulation distortion product from the sampled RF spectrum adjusts for systemic phase offsets.

The embodiments described herein disclose that sampling the spectral emissions from a plasma chamber enable direct control of the ion energy and the corresponding ion energy distribution. In some systems, it may be possible to measure plasma parameters contained in the spectral emissions using various sensors and instrumentation, including hairpin resonators, energy grid analyzers, and optical emission spectroscopy. From the output of these sensors, a correlation can be developed to determine the ion energy peak distribution in accordance with setting parameters controlling the RF power delivery system. Instrumentation such as hairpin resonators, energy grid analyzers, and optical emission spectroscopy, however, disrupt the plasma processing within the plasma chamber and have limited utility in a high-volume, manufacturing environment. In contrast, the various embodiments described in this disclosure result from less disruptive RF power sampling to achieve a self-contained RF power delivery system solution.

Therefore, by adjusting the RF waveform in accordance with spectral emissions from the plasma chamber, a narrow IEDF can be provided, meeting various industry requirements. In general, lower excitation frequencies generated at a bias power supply result in higher ion energy. Higher ion energy in turn provides improved etch rates. However, while lower frequencies provide higher ion energies, the distribution of the ions is considerably wider. Typically, it is desirable to have all ion energies grouped into a single peak (such as the mono-energetic peak discussed above) versus two broad peaks. For example, ion energy at 15-30 eV can damage material in the 1-2 nm range. When a single frequency drives the bias electrodes, each peak provides two different material removal rates. With two different material removal rates, the etch rate improvement gained by the lower frequency and increased power at best only yields an average etch rate from the two peaks. To obtain improved surface material removal fidelity, it is desirable to form an ion energy distribution for a constant material removal rate. The various embodiments discussed in the present disclosure provide a single peak, mono-energetic group of ions for the same etch rate with constant material rate. The improved etch rates also provide improved selectivity.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A radio frequency (RF) system comprising:
a first RF generator including a first power source, the first RF generator generates a control signal; and
a second RF generator including a second power source, the second RF generator receives the control signal from the first RF generator, the control signal including phase and frequency information, the second RF generator including a signal processing unit, the signal processing unit generating at least one of a phase or a power command applied to the second power source that varies in accordance with the control signal.

2. The RF system of claim 1 wherein the signal processing unit further includes a phase determination processor, the phase determination processor receives a phase signal from a harmonic/IMD processor and generates the control signal to the second power source, the control signal varies the phase or frequency of a signal output by the second power source, wherein the harmonic/IMD processor analyzes spectral emissions from a load powered by one of the first RF generator or the second RF generator.

3. A radio frequency (RF) power delivery system comprising:
a first power supply that generates a first RF output signal;
a second power supply that generates a second RF output signal;
a sensor that detects spectral emissions from a load, the spectral emissions including at least one of a harmonic of the first or second power supply and intermodulation distortion (IMD) between the first RF signal and the second RF signal; and
a controller that varies the second RF output signal in accordance with at least one of a control signal from the first power supply, or at least one of the harmonic or the IMD.

4. The power delivery system of claim 3 wherein one of the first power supply or second power supply is a master power supply, and the other of the first power supply or the second power supply is a slave power supply.

5. The power delivery system of claim 3 wherein the load is an inductively coupled plasma (ICP) system.

6. The power delivery system of claim 3 wherein the first power supply and the second power supply operate at substantially the same frequency.

7. The power delivery system of claim 6 wherein the controller varies the second RF output signal in accordance with the harmonic.

8. The power delivery system of claim 3 wherein the first power supply and the second power supply operate at different frequencies.

9. The power delivery system of claim 8 wherein the controller varies the second RF output signal in accordance with the harmonic and the IMD.

10. The power delivery system of claim 8 wherein one of the first power supply or the second power supply operate at a harmonic frequency of the other of the first power supply or the second power supply.

11. The power delivery system of claim 10 wherein the controller varies the second RF output signal in accordance with the harmonic and the IMD.

12. The RF system of claim 11 further comprising a signal processing unit including a harmonic/IMD processor, the harmonic/IMD processor analyzes spectral emissions from the load, wherein the signal processing unit generating at least one of a phase or a power command applied to the second power supply.

13. The RF system of claim 12 wherein one of the first power supply or second power supply is a master power supply, and the other of the first power supply or the second power supply is a slave power supply.

14. A method for controlling a radio frequency (RF) generator comprising:
detecting spectral emissions from a load, the spectral emissions including at least one a harmonic and intermodulation distortion (IMD); and
varying an output signal of a RF power source in accordance with one of the harmonic or the IMD detected in the spectral emissions; and
one of:
operating a first power supply and a second power supply at substantially the same frequency, or operating the first power supply and the second power supply at different frequencies.

15. The method of claim 14 further comprising varying operation of one of the first power supply or the second power supply in accordance with the harmonic when the first power supply and the second power supply operate at substantially the same frequency.

16. The method of claim 14 further comprising varying operation of one of the first power supply or the second power supply in accordance with the harmonic and the IMD when the first power supply and the second power supply operate at different frequencies.

17. The method of claim 14 further comprising operating one of the first power supply or the second power supply at a harmonic frequency of the other of the first power supply or the second power supply when the first power supply and the second power supply operate at different frequencies.

18. The method of claim 17 further comprising varying operation of one of the first power supply or the second power supply in accordance with the harmonic and the IMD.

* * * * *